United States Patent [19]

Schuenemann

[11] 4,400,793
[45] Aug. 23, 1983

[54] METHOD AND ARRANGEMENT FOR FAST ACCESS TO CCD-STORES

[75] Inventor: Claus Schuenemann, Schoenaich, Fed. Rep. of Germany

[73] Assignee: International Business Machines Corp., Armonk, N.Y.

[21] Appl. No.: 350,456

[22] Filed: Feb. 19, 1982

Related U.S. Application Data

[63] Continuation of Ser. No. 86,215, Oct. 18, 1979, abandoned.

[30] Foreign Application Priority Data

Dec. 12, 1978 [DE] Fed. Rep. of Germany ....... 2853501

[51] Int. Cl.³ .............................................. G06F 13/06
[52] U.S. Cl. .................................................. 364/900
[58] Field of Search ... 364/200 MS File, 900 MS File

[56] References Cited

U.S. PATENT DOCUMENTS

| 3,257,645 | 6/1966 | Lekven | 364/900 |
| 3,839,704 | 10/1974 | Spencer | 364/200 |
| 4,149,239 | 4/1979 | Jenkins | 364/200 |

OTHER PUBLICATIONS

*Communications of the ACM,* "Optimal Shift Strategy for a Block-Transfer CCD-Memory," vol. 21, May 1978-pp. 423–425.
"*Operation and Applications of MOS Shift Registers,*" M. Hoff et al., Computer Design, vol. 10, Feb. 1971, pp. 57–62.
"DASD Access Method Operation from Roll-Mode Record Locations", F. J. Aichelmann, Jr., vol. 21, No. 11, IBM TDB, pp. 4533–4534.
"*Solid State Memory Offers New Organizations,*" D. Marcian et al., Elec. Design News, vol. 14, No. 20, Oct. 15, 1969, pp. 55–61.
"*Working Set Restoration–A Method to Increase the Performance of Multilevel Storage Hierarchies,*" P. Schneider–Computer Confer, vol. 45, Jun. 1976, pp. 373–386.
"*Shift Register Storage,*" W. F. Beausoleil, IBM TDB, vol. 13, No. 5, Oct. 1970, pp. 1336–1337.
"*Prepaging in Memory Hierarchies*", C. Scheunemann, IBM TDB, vol. 21, No. 4, Sep. 1978, pp. 1512–1513.
FR 2 326740, (Siemens).

*Primary Examiner*—Harvey E. Springborn
*Attorney, Agent, or Firm*—James E. Murray

[57] ABSTRACT

To reduce the mean access time to storage blocks in CCD storage, a block which is most likely to be accessed next is detected after each access. While the accessed block is being processed, a selected block is moved at the high cyclic speed of the CCD storage to a shift position, and the CCD storage is then switched to the low speed. The distance of the shift position from a read/write position is such that it can be covered by the selected block at low speed within the mean time between two accesses to the CCD storage. At the time of the next access, the selected block is very likely to be close to the read/write position. In systems with virtual addressing, the block with the next virtual address would be the selected block. In other layouts, the access sequences to the CCD blocks are stored and are subsequently used to select the block which is most likely to be accessed next.

3 Claims, 3 Drawing Figures

ASSOCIATIVE COMPARISON    TO CCD CONTROL

METHOD AND ARRANGEMENT FOR FAST ACCESS TO CCD-STORES

This is a continuation, of application Ser. No. 86,215 filed Oct. 18, 1979, which is now abandoned.

INTRODUCTION

The invention is concerned with a storage hierarchy using a charge-coupled device (CCD) storage unit and more particularly it is concerned with reducing the access time between such a CCD storage and the next faster storage unit in the hierarchy.

Hierarchies of different types of storage units are used in high-performance digital computer systems to provide digital storages which have both high capacity and low access time. In such hierarchies, the low capacity of the fastest storage unit is compensated for by maintaining information in slower high-capacity storage in units which when needed can be transferred to the fastest storage unit. These storage hierarchies are used in computer systems with virtual addressing that have a high-speed work storage (cache) between the processor and the main storage.

In storage hierarchies, great differences in the access times between interfacing storage units are detremental. It is desirable to maintain the access time of the slower of the two interfacing units to about one to two orders of magnitude above that of the faster of the two interfacing units. Such differences in access time allow the units to operate in what is known as the synchronous hierarchy mode where the processor waits until the data for access are available in the top-most hierarchy level. Larger differences in time require the use of process switching where additional circuits and complex controls are used to switch between different processes to avoid a processor standstill.

Charge-coupled device (CCD) storages have properties which render them suitable for use in storage hierarchies between electronic and mechanical storage units in the hierarchy. Such CCD storages can contain several shift registers connected in parallel to a common read/write register in what is called a serial-parallel-serial loop (SPS).

These CCD storages are volatile storages and when they are not being addressed or accessed, they are driven at a low shift frequency (standby frequency) to frequently refresh the stored data. When a CCD storage operating at standby frequency is addressed, the selected block of data is transferred to the read/write station at the high operating frequency (operating speed) and is read (or written) at an equally high operating frequency. To take advantage of the high storage density, the individual storage loops must not be too small. A loop with a capacity of about one kilobyte and an operating frequency of one megabit per second would be suitable for this purpose. However, the access time of such a loop can vary from several hundred milliseconds up to several milliseconds with the mean access time corresponding to half a loop cycle, say, for example, 5 milliseconds. It has already been proposed in German Auslegeschrift 2 165 765 that the mean access time of stored information can be reduced in a shift register by reordering that information in such a manner that the information which was the last to be read can be immediately reaccessed. For this purpose, additional data paths and an access control are provided in the shift register.

THE INVENTION

In accordance with the present, the mean access time of charge-coupled device storages in storage hierarchies is reduced by a new access scheme. In this new accessing scheme, the block of data which is most likely to be accessed next is determined and then advanced at the high operating frequency (operating speed) to a position within the CCD loops, from which it can reach the read/write station of the CCD storage at low speed (standby speed) in the mean period of time between two CCD accesses. If the selected block is not accessed during this time interval, it passes at low speed below the read/write head without being read, and then is subsequently moved at high speed to the starting or shift position for switching to low speed.

In a hierarchy with virtual addresses it can be assumed in the first approximation that the blocks are sequentially processed with ascending virtual addresses. After the block with the virtual address n has been read, the CCD block with the address n+1 is moved to the shift position in this model, and the CCD storage is subsequently switched to low speed.

In another example, the block which is most likely to be accessed next is determined by analyzing the sequence of the preceding block accesses. With a number of programs it may be assumed that upon invocation of a particular block, the same block sequences are regularly invoked in the same order. By recording this sequence of invocations, it is possible the next time the same block is invoked to deduce therefrom the subsequent blocks at a high degree of probability and to correspondingly move them to the CCD loop shift position.

In a further example, when the CCD storage is loaded, other blocks are introduced between blocks which are likely to be invoked in direct succession; the distance between two data blocks (first and second block) to be successively read being chosen in such a manner that after the first block has been read and after switching to the standby frequency, the second block reaches the read/write station in the time corresponding to the main time between two CCD accesses. By modifying the replacement algorithm, this block sequence can be roughly maintained even when individual CCD blocks are pushed to background storages.

Thus, the reduction of the access time in the hierarchy does not require expensive control circuits or special data paths. The proposed method is very flexible and, by suitably selecting the hierarchy parameters, such as block size, allocation of the blocks to the CCD storages, selection of the block which is most likely to be accessed, can be optimized and adapted to different conditions. Of special interest is the automatic selection of the block which is most likely to be accessed next by means of the system proper in accordance with the preceding program cycle. The method in accordance with the invention can be used on its own or in conjunction with other measures to optimize a storage hierarchy.

THE DRAWINGS

An example of the invention will be described in detail below by means of the accompanying drawings.

DETAILED DESCRIPTION

Figure 1:
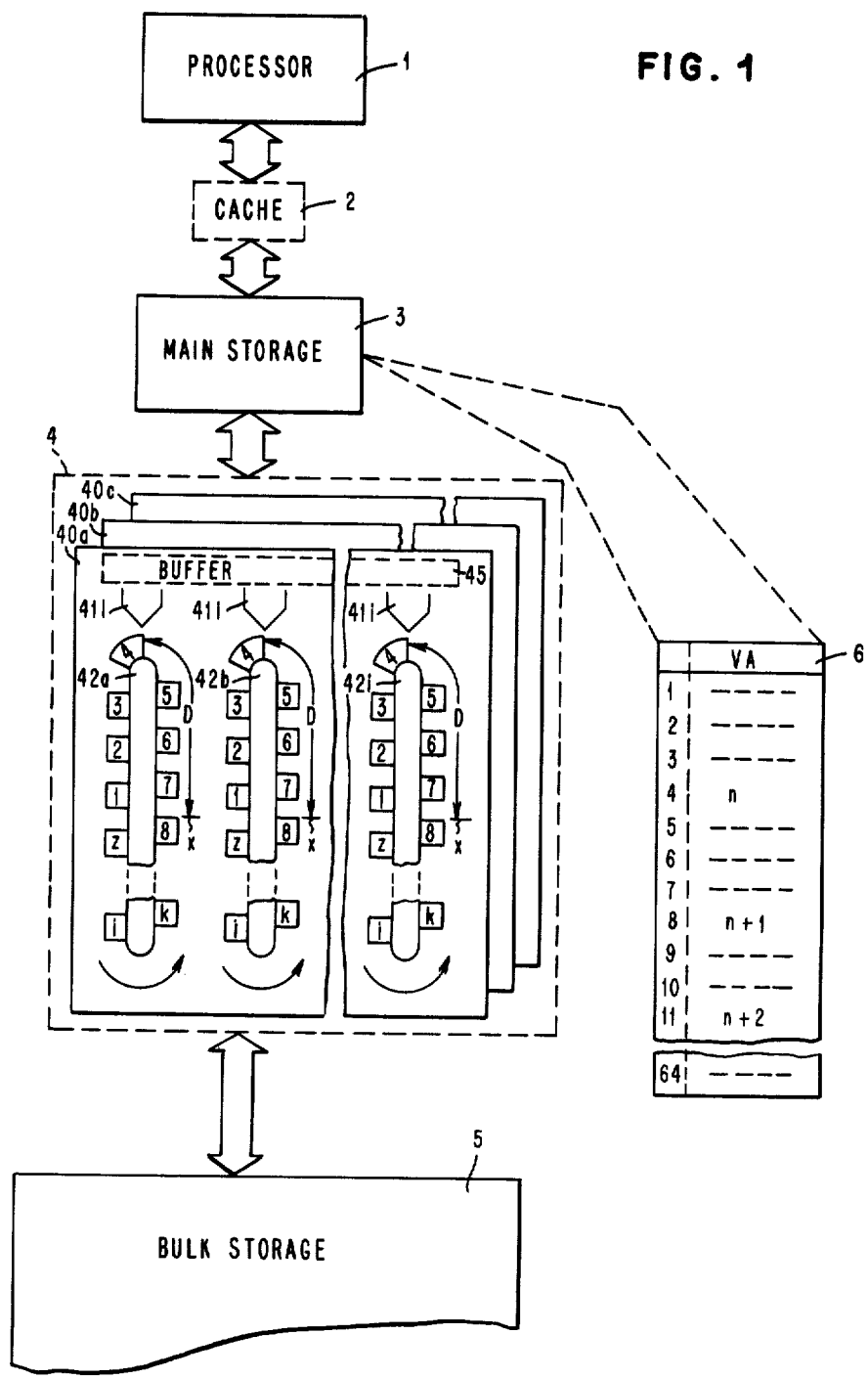
FIG. 1 is a basic circuit diagram of a hierarchy with a CCD storage.

FIG. 1 is a schematic representation of a processor 1 interacting with a storage hierarchy. The hierarchy consists, for example, of a high-speed work storage (cache) 2, a main storage 3, a storage 4 made up of charge-coupled devices, and a bulk storage 5, such as disk or cassette storages. The cache storage 2 does not exist in all storage hierarchies, but is included in high-performance systems. In this particular hierarchy, the CCD storage 4 is to close the "access gap" between the main storage 3 and the bulk storage 5 which has long access time 5.

The invention essentially concerns the interaction between the main storage 3 and the CCD storage 4. If the CCD storage 4 has a sufficiently high storage capacity to satisfy the needs of the system, the bulk storage 5 can be eliminated, so that the hierarchy is reduced to the elements 3 and 4.

For the physical layout of the hierarchy, storage ports in accordance with FIG. 1, which are especially provided for this purpose, can be used, but it is equally possible to interconnect the individual elements of the hierarchy via a common bus.

Management of the storage hierarchy and the control of access requests of the processor are generally effected by means of virtual addresses. For this purpose, the virtual address space can be represented in a different manner by means of the existing elements of the storage hierarchy. In the hierarchy of FIG. 1, the storages 4 and 5, for example, can be driven as background storages for the main storage 3; in such a case they contain the program parts with non-active virtual addresses, which have been removed from main storage. In another operating example, the storages 3 and 4 together may take the form of an extended main storage with a continuous address area, with the bulk storage 5 serving as the appertaining background storage. Details of these different examples will be described later on.

The CCD storage 4 consists of a module with a number of storage chips 40a, 40b, each of which contains several storage loops 42a, 42b with associated read/write stations L/S 41a, 41b. A buffer area 45 for reading and writing storage loops is available with some embodiments of CCD storage chips. The design and operation of CCD storages are known from the art and are described, for example, in the publication, "Aufbau, Organisation und Einsatz von Ladungstransport-(CCD-)Speichern" by H. J. Harloff, NTG-Fachberichte, Vol. 58, Berlin 1977, page 146.

The data contained in CCD storage 4 are divided into data blocks. Individual bit positions of a byte of data of the data block are each placed on a different chip in the same loop, location. For instance, loop 42a, of each of the nine storage chips 40 contains one bit of the byte (8 data bits and one parity bit) from the block. Each storage chip has, one hundred and twenty eight such loops 42. The storage capacity of a loop is 2 kilobits. Each loop is divided into 64 sub-blocks with 32 bits each and a data block of 4 K bytes occupies one of the sub-blocks of each storage loop.

Within a storage module BSM the individual storage loops move synchronously. For reading and writing a 4 K data block, all storage loops have to be moved by 32 bit positions past the read/write heads 41.

To ensure that the times for reading and writing a data block do not become too long, and to ensure that the buses to the main and bulk storages are not occupied too long, the data exchange with these hierarchy components is effected in smaller blocks, for example, 128 bytes. Thus, such a data exchange requires 128 microseconds at a clock frequency of the CCD storage of one megabit per second.

If information is to be written or read at a random position of a storage loop, the above-mentioned organization requires on an average a latency period of $\frac{1}{2}$ 4 kilobits $10^{-6}$ seconds/bit = 2 milliseconds.

To reduce this latency period, the invention proposes that, after a data block (e.g., 4 in FIG. 1) has been read, the block which is most likely to be accessed next be moved at the high advancing speed (operating frequency) of the loops to the position designated as X. Subsequently, the clock generator of the CCD storage module is switched to the low advancing speed (standby frequency), for example, to 10% of the maximum speed, i.e., in the example, to 100 kilobits/second. In the chosen example, there are three blocks with 32 bits each between this shift position X and the read/write head 41 (and the end of block 4, respectively). Until the block with the designation 8 reaches the read/write head 41, about one millisecond elapses at the low advancing speed. In this period the predecessor block has most likely been processed by the processor, and a new request is issued to the CCD storage for a read or a write process. By suitably selecting the parameters, especially the distance between the shift position X and the read/write head, it can be ensured that the block which is most likely to be accessed next reaches the read/write head on an average at the very time the corresponding access request is issued. If the next request is issued before the block reaches the read/write head, the remaining shift is effected at the high advancing speed. As a result of the shift to position X, on an average only half the distance between shift position X and read/write head will have to be covered at the high advancing speed after receipt of an access request, i.e., the latency period is reduced to about 50 microseconds (instead of the previous two milliseconds). During this short period of time, the processor can assume the wait status, no longer needing to effect any process switches. Thus, processor and storage hierarchy operate synchronously.

In a virtual address storage hierarchy, the block which is most likely to be accessed next is determined on the assumption that the blocks with ascending virtual addresses are sequentially processed. (In systems with virtual addresses the term "page" can be used in place of the term "block"). Thus, after the block with the virtual address n has been processed, the block with the virtual address n + 1 has to be moved to shift position X. From the directory 6 (FIG. 1) of the CCD storage, (which for fast access is stored in the main storage 3), it may be seen that in the example, after block 8 has been accessed, block 11 contains the required virtual addresses (VA) and thus has to be moved to shift position X at the high advancing speed. In the first column of the directory 6 of the number of the CCD data block is specified; the occupation of the directory by virtual addresses is arbitrary. The maximum number Z of sub-blocks of each loop is Z = 64.

Figure 2:
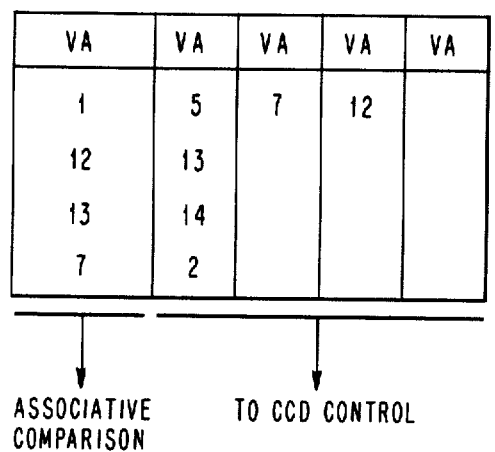
FIG. 2 is a table of a partly associative selection storage for the subsequent page.

A further method of determining the block (or the blocks) which is (are) most likely to be accessed next is shown in FIG. 2. During the program cycle, a storage 20 with an associative part 21 contains the (virtual) address VA of the currently active block. Into the appertaining, non-associative storage parts 22a to 22d the addresses of those blocks are entered which were are accessed from the respective active block. For this purpose, four to eight storage positions can be provided, for example.

If during the program cycle a previously active block is pushed from main storage into the CCD storage, only the entry in storage 20 is retained. When this block is accessed later (i.e., when it is transferred from the CCD storage back to the main storage), the blocks referred to by the earlier request are located with the aid of the entries in storage 20 and are fed one after the other to shift position X. Assuming that the same access sequence is performed as a result of a renewed request, the latency periods of the CCD storage can be reduced as described above.

This assumption applies in particular to complex programs utilizing different components of the operating system and other system control programs. A case in point for this are programs for teleprocessing. Several layers of system programs, which are successively implemented in the course of the program cycle, are superimposed upon the actual problem programs in this area. In this manner, a frequently recurring access sequence to storage blocks with instructions (or data) is obtained, which could be utilized for determining the page which is most likely to be accessed.

A program, in the course of which the following blocks are successively invoked (access sequence), will be dealt with by way of example

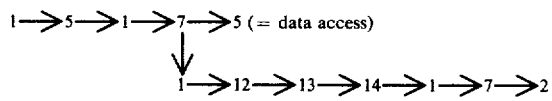

At the beginning of program execution, the main storage is assumed to contain no blocks; every time a block is transferred from the CCD storage to the main storage, an entry is made in the non-associative part of the line associated with the invoking block. (The invoking block is recorded in the associative part of this line).

If during a transfer from the CCD storage to the main storage it is found that a line in the table of FIG. 2 has not yet been allocated to the invoking block, the virtual address of the invoking block is entered into the associative part of a blank line.

Requests of blocks already stored in main storage are not entered into the table. The table occupation thus resulting for the access sequence as shown above is illustrated in FIG. 2. By means of an associative comparison of the actual block address with the entries in the first table column, it is determined whether a line in the table has already been allocated to an invoking block.

If the table overflows, the oldest entry (whose use goes back farthest) is overwritten.

The non-associative part of the table in accordance with FIG. 2 is issued to the CCD control if in the later course of the program a block specified in the associative part of the table (which at that stage is stored in the CCD) is transferred back to the main storage.

By means of the addresses of the recorded subsequent pages, which are read from the table, the corresponding blocks in the CCD storage are moved to shift position X.

If the CCD storage consists of several modules 4 (in FIG. 1) which can be operated independently of each other (i.e., they have a clock control of their own) and the program blocks are more or less uniformly distributed over the modules, the subsequent blocks arranged on different modules can, as a precautionary measure, be simultaneously moved (according to the addresses in the table of FIG. 2) to the respective shift position X of the individual CCD modules.

The previous discussion was based on the assumption that the block which is most likely to be accessed next is contained in CCD storage 4. This assumption is normally fulfilled, since the high capacity of the CCD storage (several hundred kilobytes per module) permits all appertaining blocks to be transferred from the bulk storage to the CCD storage upon activation of a process. In the other cases the missing block had to be transferred in the usual manner from the background storage (bulk storage) to the CCD storage during the program cycle.

Figure 3:
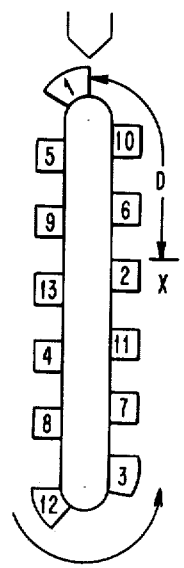
FIG. 3 shows the CCD storage occupied by presorted data blocks.

The method proposed by the invention can be improved even further by ordering the blocks in the CCD storage in accordance with their likely request sequence upon loading the program blocks of a process and by inserting between successive blocks other blocks in such a manner that the distance required for speed switching is obtained. FIG. 3 shows an example of a storage loop with 13 blocks; between 2 blocks each with successive numbering (e.g., 1 and 2) two further blocks are inserted. Thus, block 2 to be read after block 1 has been processed will already be at the required shift position X.

If no bulk storage is used, the sequence of the blocks in the CCD storage is maintained during the operation of the storage hierarchy; in the CCD storage a block transferred from said storage to the main storage is written back to the shift position, if it will again be pushed from the main storage in the further course of the program.

In the main storage, preferably one storage block is always kept free for a block to be newly read; during the processing of this block, a further storage block can be cleared, by the block which has been used least being written back to its original position in the CCD storage.

If, while a process is being performed, there is a data exchange between the CCD storage and the bulk storage within the hierarchy, this sequence will be interfered with, since blocks from the CCD storage are pushed into the bulk storage and new blocks are to be written in. In this case, the performance of the CCD storage can be optimized by a replacement algorithm, which interferes as little as possible with the page sequence, being selected for the pages to be pushed from the CCD storage. In the example of the known least recently used (LRU) algorithm, the procedure used may be such that instead of the page which is actually used least, that page of the 8 least used pages is removed, by which the ascending sequence of the pages in the CCD storage is interfered with least. This will be explained by means of the following example: It is assumed that the sequence of the blocks in the CCD storage is 1, 2, 4, 6, 7, 9, 10, and that the block to be newly written in bears the number 3. The block used least in the CCD storage is assumed to be 9, and the blocks used least after block 9 are assumed to be 10, 7, and 4. In order to interfere as little as possible with the block sequence, block 4 will be removed in this case, and in its place block 3 will be written into the CCD storage.

To improve the performance of such a storage hierarchy with CCD storages still further, the following measures can be taken: Use of two buffer storages 45 in FIG. 1, which are alternately employed for the look-ahead loading of the page which is not likely to be accessed, use of several CCD storage modules each with independent clock generators and interleaved allocation of the data blocks to the different modules, separation of data blocks with instructions on the one hand and input/output data on the other.

The previously proposed method of improving the performance of storage hierarchies with CCD storages can also be readily applied to other storages organized in a similar manner. Examples of such storages are so-called magnetic bubble storages in which cylindrical magnetic domains are combined in shift registers and are organized in the manner of a cyclic storage. Such storages are described, for example, on pages 199 and 210 of the aforementioned NTG-Fachbericht, Vol. 58, Berlin 1977.

As these magnetic storages are not volatile (and in comparison with CCD storages do not have to be refreshed at a particular minimum frequency, namely, the standby frequency), they are at a standstill in the non-addressed state. Thus, their standby speed is zero. To reduce the mean access time to a data block in a magnetic bubble storage, it is possible to determine the block which is most likely to be accessed next, using one of the methods described above, and to move the block thus determined immediately in front of the access station, while the block previously read is being processed. The former block remains in that position until the next access request is issued to the magnetic bubble storage. Because of the physical properties of magnetic bubble storages, the block may be shifted to the specified position in both cyclic directions of the loop; thus, it is always possible to choose that cyclic direction in which the block is moved to the shift position fastest.

Having thus described my invention, what I claim as new, and desire to secure by Letters Patent is:

1. The method of transfer of units of data between a random access storage and a slower cyclic storage which operates at a fast cyclic speed when it is accessed for transfer of data and a slow cyclic speed when it is not so accessed and which stores each of a plurality of units of data in a separate one of a plurality of storage locations that move passed the accessing point in series comprising, (a) arranging data units in the cyclic store so that units of data that follow each other in the expected accessing sequence are not in adjacent storage locations but are separated from one another by at least one other storage location containing another unit of data so as to place the unit of data expected to be accessed next where it can be reached at the slower cyclic speed in the mean time between two accesses, (b) recording an actual accessing sequence of the units of data, (c) operating the cyclic memory at the fast cyclic speed between accesses until the unit of data occurring next the recorded actual accessing sequence is moved to a position where it can be reached at the slow cyclic speed in the mean time between two accesses, (d) operating the cyclic memory at the slow cyclic speed after step c and until the next access and (e) operating the memory at the fast cyclic speed while the unit of data requested by said next access approaches the accessing point.

2. The method of claim 1 wherein said expected accessing sequence is in the ascending order of virtual addresses.

3. The method of claim 2 where data units are transferred into the cyclic storage from a third bulk storage by a modified least recently used algorithm that replaces that one of a number of least recently used units of data that least disturbs said expected accessing sequence.

* * * * *